(12) United States Patent
Kushiyama et al.

(10) Patent No.: US 7,417,295 B2
(45) Date of Patent: Aug. 26, 2008

(54) INSULATED GATE SEMICONDUCTOR DEVICE AND MANUFACTURING METHOD THEREOF

(75) Inventors: Kazunari Kushiyama, Gunma (JP); Tetsuya Okada, Saitama (JP); Makoto Oikawa, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 1 day.

(21) Appl. No.: 11/496,723

(22) Filed: Aug. 1, 2006

(65) Prior Publication Data

US 2007/0034943 A1 Feb. 15, 2007

(30) Foreign Application Priority Data

Aug. 2, 2005 (JP) ............................. 2005-224606

(51) Int. Cl.
*H01L 21/60* (2006.01)
(52) U.S. Cl. .................. 257/459; 257/779; 257/782; 257/784
(58) Field of Classification Search ................ 257/459, 257/779, 782, 784, E23.015, E23.02, E23.028; 438/612
See application file for complete search history.

(56) References Cited

U.S. PATENT DOCUMENTS

| 5,502,337 | A | * | 3/1996 | Nozaki ...................... 257/773 |
| 6,022,797 | A | * | 2/2000 | Ogasawara et al. .......... 438/622 |
| 6,538,326 | B2 | * | 3/2003 | Shimizu et al. ............. 257/758 |
| 6,727,590 | B2 | * | 4/2004 | Izumitani et al. ............ 257/758 |
| 7,217,979 | B2 | * | 5/2007 | Matsunaga et al. .......... 257/355 |
| 2002/0006717 | A1 | * | 1/2002 | Yamaha ....................... 438/612 |
| 2002/0011669 | A1 | * | 1/2002 | Fujiki et al. ................. 257/751 |
| 2002/0043723 | A1 | * | 4/2002 | Shimizu et al. ............. 257/758 |
| 2002/0145206 | A1 | * | 10/2002 | Park et al. .................... 257/782 |
| 2003/0042499 | A1 | * | 3/2003 | Reiner ........................ 257/173 |
| 2003/0080428 | A1 | * | 5/2003 | Izumitani et al. ............ 257/758 |
| 2004/0016949 | A1 | * | 1/2004 | Semi .......................... 257/300 |
| 2005/0023692 | A1 | * | 2/2005 | Matsunaga et al. .......... 257/758 |
| 2005/0042853 | A1 | * | 2/2005 | Gasner et al. ............... 438/612 |
| 2005/0173801 | A1 | * | 8/2005 | Mimura et al. .............. 257/758 |
| 2005/0269702 | A1 | * | 12/2005 | Otsuka ....................... 257/750 |
| 2006/0125118 | A1 | * | 6/2006 | Yamazaki ................... 257/784 |
| 2006/0267222 | A1 | * | 11/2006 | Saito .......................... 257/786 |
| 2007/0052068 | A1 | * | 3/2007 | Takemura et al. ........... 257/637 |
| 2007/0182001 | A1 | * | 8/2007 | Kanzaki et al. ............. 257/734 |

FOREIGN PATENT DOCUMENTS

| JP | 08-255911 | 10/1996 |
| JP | 2002-368218 | 12/2002 |

OTHER PUBLICATIONS

Korean Office Action dated Jun. 22, 2006, directed to counterpart KR application No. 10-2006-0070114.

* cited by examiner

*Primary Examiner*—George Fourson
(74) *Attorney, Agent, or Firm*—Morrison & Foerster LLP

(57) ABSTRACT

Two metal electrode layers are provided. A first electrode layer is patterned with a minute separation distance according to an element region as in the case of the conventional case. Meanwhile, it suffices that a second electrode layer be in contact with the first electrode layer. Thus, no problems arise even if the separation distance is elongated. Specifically, the second electrode layer can be set to have a desired thickness. Moreover, by disposing a nitride film on the first electrode layer below a wire bonding region, even when volume expansion is caused by an Au/Al eutectic layer, transmission of stress to the element region can be prevented.

18 Claims, 8 Drawing Sheets

Prior Art

INSULATED GATE SEMICONDUCTOR DEVICE AND MANUFACTURING METHOD THEREOF

BACKGROUND OF THE INVENTION

Priority is claimed to Japanese Patent Application Number JP 2005-224606 filed on Aug. 2, 2005, the disclosure of which is incorporated herein by reference in its entirety.

1. Field of the Invention

The present invention relates to an insulated gate semiconductor device and a manufacturing method thereof. More particularly, the present invention relates to an insulated gate semiconductor device which reduces an ON-resistance of the device, and which corrects a failure in wire bonding, and a manufacturing method thereof.

2. Description of the Related Art

FIGS. 9A and 9B show a conventional semiconductor device. FIG. 9A is a cross-sectional view and FIG. 9B is a plan view. FIG. 9A is a cross-sectional view taken along the line b-b in FIG. 9B.

As shown in FIG. 9A, an element region 51 is provided with, for example, a MOSFET 52 having a trench structure. Specifically, a drain region is formed with providing an n−type epitaxial layer on an n+ type silicon semiconductor substrate 31, and a p type channel layer 34 is provided thereon. Thereafter, a trench 37, which penetrates the channel layer 34 to reach the drain region 32, is formed, and an inner wall of the trench 37 is covered with a gate oxide film 41. Thus, a gate electrode 43, which is made of polysilicon buried in the trench 37, is provided. In a surface of the channel layer 34 adjacent to the trench 37, an n+ type source region 45 is formed. Moreover, in the surface of the channel layer 34 between the source regions 45 respectively of each two adjacent cells, a p+ type body region 44 is provided. The gate electrode 43 is covered with an interlayer insulating film 46. On the interlayer insulating film 46, a metal electrode layer 47, which is connected to the element region 51, is provided.

As shown in FIG. 9B, the metal electrode layer 47 is patterned into a predetermined shape, and forms a source electrode 47s, which covers the entire surface of the element region 51, a gate pad electrode 47g, and the like. The source electrode 47s is in contact with the source region 45 and the body region 44. Moreover, the gate pad electrode 47g is connected to the gate electrode 43 in the element region 51 through a protection diode D or the like.

On the metal electrode layer 47, a nitride film 50, which serves as a protective film, is provided. An opening is provided in the nitride film 50 and a bonding wire 60 is fixed therein. This technology is described for instance in Japanese Patent Application Publication No. 2002-368218.

The bonding wires 60 are fixed, for example, at four spots on the source electrode 47s covering the element region 51, and at one spot on the gate pad electrode 47g.

In an insulated gate semiconductor device such as a MOSFET, reduction in an ON-resistance has been an important factor for improving characteristics of the insulated gate semiconductor device. Various methods are adopted for the reduction in the ON-resistance. For example, a resistance value of the metal electrode layer 47 (the source electrode 47s), which is in contact with the entire surface of the element region, is easily reduced at relatively low costs. To be more specific, the metal electrode layer 47 made of aluminum alloy is generally adopted as a metal layer having a low resistance value.

However, in the case of the metal electrode layer 47 made of aluminum alloy, when thin gold (Au) wires are used as bonding wires, there is a problem that a failure occurs after a certain period of time passes, for example. Specifically, when an Au ball is fixed directly to the metal electrode layer 47, Au and Al are mutually diffused in an interface therebetween as time passes. Thus, an Au/Al eutectic layer is formed. The Au/Al eutectic causes volume expansion, and stress generated at the time of the volume expansion applies pressure to the interlayer insulating film 46.

When the pressure is applied to the interlayer insulating film 46, cracks C are generated (see FIG. 9A). Accordingly, there is a problem that a leak occurs between a gate and a source.

Moreover, when further reduction in the ON-resistance is sought, for example, it is also conceivable that a metal layer having a lower resistance value is adopted instead of the aluminum alloy layer. If the metal layer is not the aluminum alloy layer, occurrence of the cracks C due to the Al/Au eutectic described above can be avoided. However, an existing sputtering apparatus can be utilized for the aluminum alloy layer, and the layer is formed at low costs. Moreover, the aluminum alloy layer is easily patterned, and is suitable as the metal electrode layer 47. Therefore, the resistance value can be further reduced by adopting the aluminum alloy as the metal electrode layer 47, and by increasing a thickness of the metal electrode layer 47.

However, there is a limitation on an increase in the thickness of the aluminum alloy. Specifically, in a case where the aluminum alloy is patterned by low-cost wet etching, side etching takes place for an amount equivalent to that of etching in a depth direction. Thus, the larger the thickness of the aluminum alloy is, the longer distance between adjacent patterns (for example, the gate pad electrode 47g and the source electrode 47s) needs to be secured. As a result, pattern arrangement including the element region 51 and the gate pad electrode 47g increases in area more than necessary. Thus, there is a problem that a chip size is increased.

Meanwhile, if dry etching is adopted, no side etching takes place. However, an etching apparatus is expensive. Moreover, an etching selection ratio of a resist film as an etching mask to the aluminum alloy imposes a limit on a thickness which can be etched. Specifically, a dry etcher of the aluminum alloy has a low selection ratio of the resist film to the aluminum alloy. Thus, the resist film, which should be left, is etched while etching the thick aluminum alloy. Hence, a mask pattern cannot be accurately formed. Although the resist film may be formed to have a large thickness, a resolution is deteriorated in that case. For this reason, the thick resist film is not suitable for a minute pattern.

SUMMARY OF THE INVENTION

The invention provides an insulated gate semiconductor device that includes a semiconductor substrate comprising an element region comprising an insulated gate element formed in the substrate, a lower electrode layer disposed on the element region and connected with the element region, an upper electrode layer disposed on the lower electrode layer so that part of the upper electrode layer is in contact with the lower electrode layer, and an insulating film disposed between the lower and upper electrode layers.

The invention also provides a method of manufacturing an insulated gate semiconductor device. The method includes providing a semiconductor substrate comprising an element region comprising an insulated gate element formed in the substrate, forming a lower electrode layer on the element region so that the lower electrode is connected with the element region, forming an insulating film on the lower electrode so that part of the lower electrode layer is not covered by the insulating film, and forming an upper electrode layer on the insulating film and the lower electrode layer not covered by the insulating film.

The invention further provides an insulated gate semiconductor device that includes a semiconductor substrate comprising an element region comprising an insulated gate element formed in the substrate and a terminal region configured to receive a signal for the insulated gate element, a lower electrode layer comprising a first lower electrode portion and a second lower electrode portion, the first lower electrode portion being disposed on the element region and connected with the insulated gate element, the second lower electrode portion being disposed on the terminal region, and the first and second lower electrode portions defining a first gap therebetween, a patterned insulating film disposed on the lower electrode layer and filling the first gap, and an upper electrode layer disposed on the patterned insulating film and comprising a first upper electrode portion and a second upper electrode portion, the first upper electrode portion being disposed on and connected with the first lower electrode portion, the second upper electrode portion being disposed on and connected with the second lower electrode portion, and the first and second upper electrode portions defining a second gap therebetween.

DESCRIPTION OF THE EMBODIMENTS

With reference to FIGS. 1 to 8, embodiments of the present invention will be described in detail. Note that, as an example, a description will be provided for a case where an n-channel MOSFET is disposed in an element region.

Figure 1:
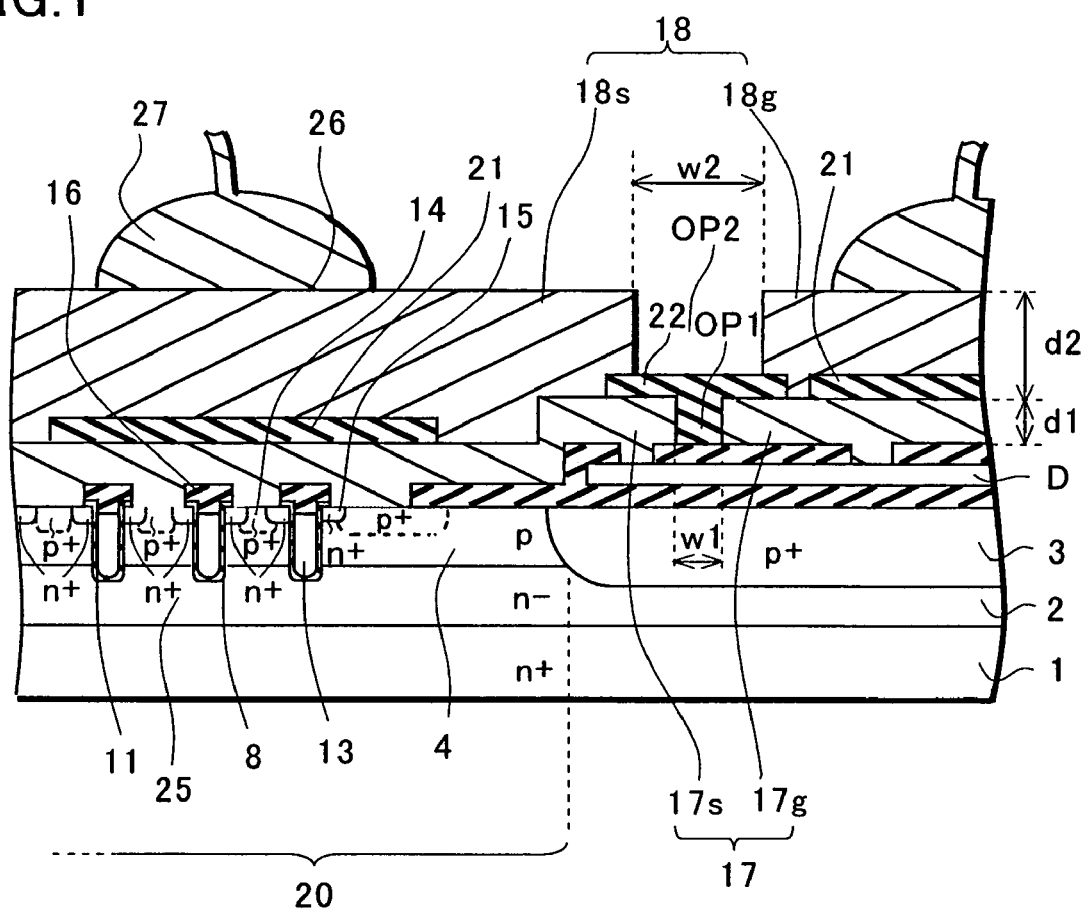
FIG. 1 is a cross-sectional view of a semiconductor device of a preferred embodiment of the present invention.

FIG. 1 shows a cross-sectional view of a semiconductor device of this embodiment.

A MOSFET 25 is formed in an element region 20 of a substrate. Note that, in this embodiment, a formation region of a channel layer, in which the MOSFET 25 is disposed, is set to be the element region 20.

A first electrode layer 17 is provided on the element region 20. The first electrode layer 17 is an aluminum alloy layer, and is connected to the element region 20. As shown in FIG. 1, the first electrode layer 17 is separated into a plurality of parts by a first opening OP1. Thus, a first source electrode 17s and a first gate pad electrode 17g are formed.

The first source electrode 17s is provided so as to cover the entire surface of the element region 20, and is connected to a source region 15 of the MOSFET 25. Moreover, the first gate pad electrode 17g is provided on the substrate surface in a chip corner part, for example, outside the element region 20. The first gate pad electrode 17g is connected to a gate electrode 13 of the MOSFET 25 through a protection diode D or the like. The first electrode layer 17 (the first source electrode 17s and the first gate pad electrode 17g) has a thickness d1 of about 3 μm.

A first insulating film 21 is disposed on the first electrode layer 17. The first insulating film is a nitride film (hereinafter referred to as a first nitride film 21) and has a thickness of 0.5 μm to 3 μm (for example, 0.7 μm). Described later in detail, the first nitride film 21 is disposed at least below a region (a wire bonding region 26) where a bonding wire 27 is fixed so as to expose a part of the first electrode layer 17.

A second electrode layer 18 covers the first electrode layer 17 and the first nitride film 21, and is in contact with the first electrode layer 17 exposed from the first nitride film 21. The second electrode layer 18 is also made of aluminum alloy, for example, and is separated into a plurality of parts by a second opening OP2 having an opening width different from that of the first opening OP1. Thus, a second source electrode 18s, which is in contact with the first source electrode 17s, and a second gate pad electrode 18g, which is in contact with the first gate pad electrode 17g, are formed. The second electrode layer 18 has a thickness d2 of, for example, about 3 μm. Note that the thickness d2 is an example, and is appropriately selected according to characteristics of the device, such as a required ON-resistance.

The MOSFET 25 is formed in a p type channel layer 4 provided on a surface of a drain region. Specifically, the drain region is obtained by providing an n− type semiconductor layer (epitaxial layer) 2 on an n+ silicon semiconductor substrate 1. A p+ type region 3 is formed in a periphery of the channel layer 4. The p+ type region 3 is located into a deeper point, and has a higher concentration, than the channel layer 4. The p+ type region 3 suppresses electric field concentration by reducing a curvature of a depletion layer at an end of the channel layer 4.

A trench 8 penetrates the channel layer 4, and reaches the n− type semiconductor layer 2. The trenches 8 are generally patterned in a lattice manner or in a stripe manner on the substrate. A gate oxide film 11 is provided on an inner wall of the trench 8, and polysilicon is buried therein to form the gate electrode 13.

On the inner wall of the trench 8, which is in contact with at least the channel layer 4, the gate oxide film 11 is provided to have a thickness of several hundred Å according to a drive voltage. The gate oxide film 11 is an insulating film, which is sandwiched between the gate electrode 13 provided in the trench 8 and the semiconductor substrate. Thus, a MOS structure is formed.

The gate electrode 13 is a conductive material buried in the trench 8. The conductive material is, for example, polysilicon. In the polysilicon, for example, n type impurities are introduced to achieve a low resistance. The gate electrode 13 is connected to the protection diode D by a connection part (not shown here) which is formed by patterning the polysilicon, and is further connected to the gate pad electrode 17g.

The source region 15 is a diffusion region, which is obtained by implanting n+ type impurities into the surface of the channel layer 4 adjacent to the trench 8. Moreover, in the surface of the channel layer 4 between the source regions 15, and in the surface of the channel layer 4 at the end of the element region 20, body regions 14, which are p+ type impurity diffusion regions, are provided. Thus, a potential of the substrate is stabilized.

An interlayer insulating film 16 is provided on the gate electrode 13. The first source electrode 17s is in contact with the source regions 15 and the body regions 14, through contact holes between the interlayer insulating films 16.

The first gate pad electrode 17g is disposed on the protection diode D which protects the fragile gate oxide film 11 from an overvoltage and the like, and is connected to one end of the protection diode D. One end of the protection diode D is connected to the gate electrode 13, and the other end thereof is connected to the first source electrode 17s.

Figure 2A:
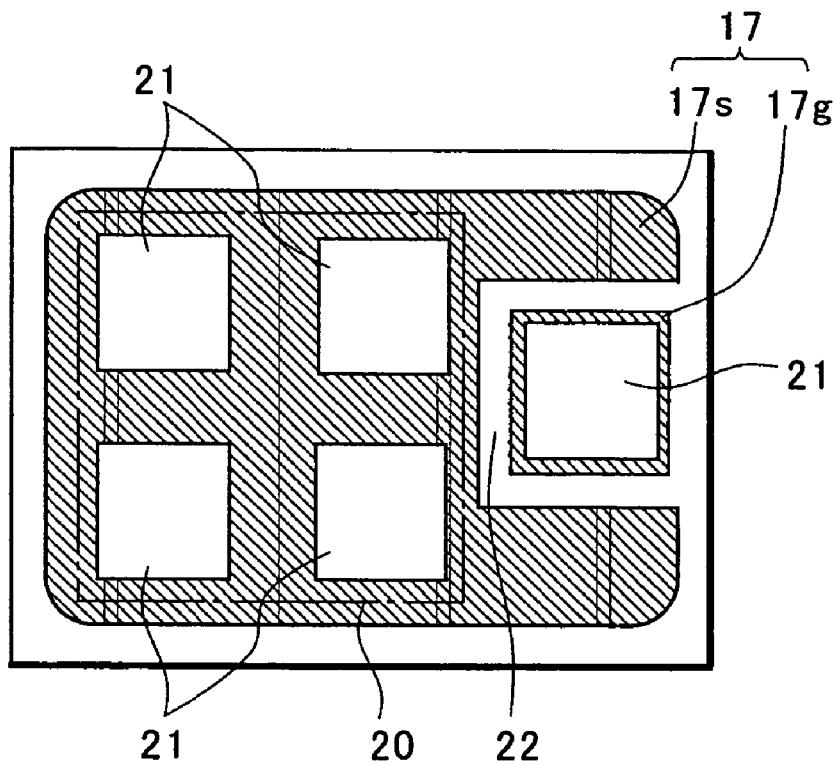
FIGS. 2A and 2B are plan views illustrating the semiconductor device of the preferred embodiment of the present invention.
Figure 2B:
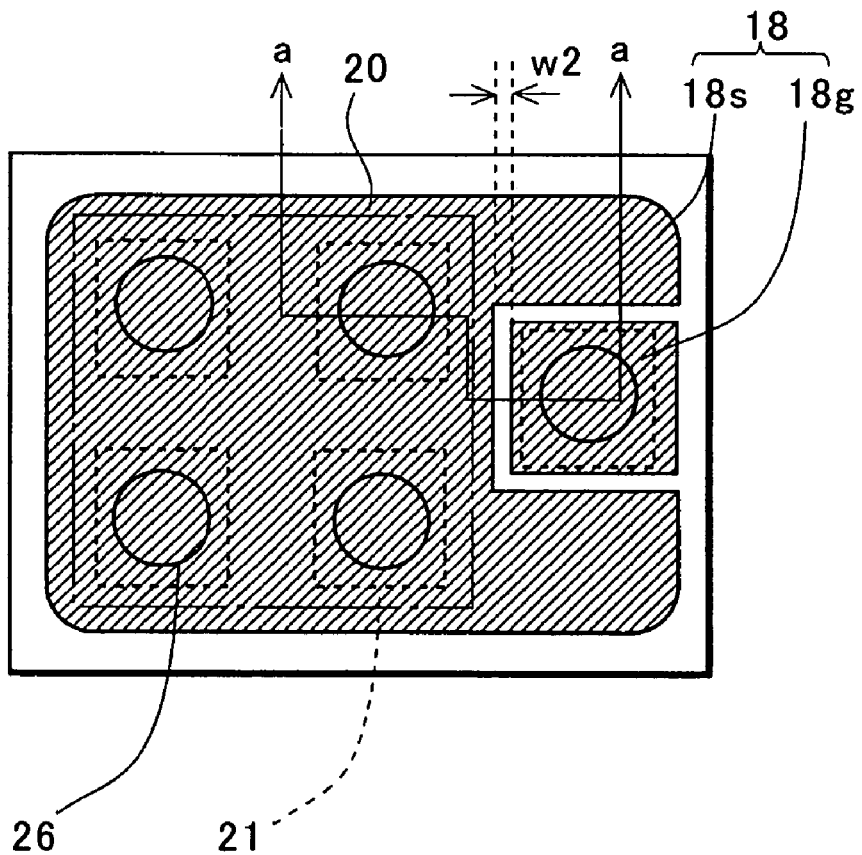

FIGS. 2A and 2B are chip plan views of the semiconductor device shown in FIG. 1. FIG. 2A is a view showing a pattern of the first electrode layer 17 and of the first nitride film 21, and FIG. 2B is a view showing a pattern of the second electrode layer 18. In FIGS. 2A and 2B, the element region 20 is indicated by a dashed line. Moreover, FIG. 1 corresponds to a cross-section along the line a-a in FIG. 2B.

As shown in FIG. 2A, the first nitride films 21 are disposed in an insular manner, for example, on the first electrode layer 17. Specifically, the first electrode layer 17 is exposed around the first nitride films 21.

In FIG. 2B, broken lines represent the pattern of the first nitride films 21 below the second electrode layer 18, and circles represent the wire bonding regions 26 on the surface of the second electrode layer 18.

For example, in the case of FIGS. 2A and 2B, the first source electrode 17s and the second source electrode 18s are provided so as to cover at least the element region 20, and a plurality of the wire bonding regions 26 are secured. Meanwhile, it suffices that the first gate pad electrode 17g and the second gate pad electrode 18g secure one wire bonding region 26.

In this embodiment, on the first metal layer 17 below the wire bonding region 26, the first nitride film 21 is disposed so as to overlap with at least the wire bonding region 26. Thus, a failure in wire bonding can be avoided. Specifically, in a case where an Au wire is wire-bonded to the aluminum alloy layer, an Au/Al eutectic layer is formed, and causes volume expansion to apply stress to the first nitride film 21. The first nitride film 21 suffers some damage such as crystal distortion and cracks. However, the first nitride film 21 makes it possible to prevent the stress from being transmitted to the element region 20. The first nitride film 21 is not provided for electrical insulation of the element region 20. Thus, even when film properties are somewhat deteriorated, for example, by the crystal distortion and the cracks, there is no influence on the device.

Accordingly, no stress is applied to the interlayer insulating film 16 in the element region 20. Thus, it is made possible to prevent short-circuiting caused by the cracks C in the interlayer insulating film 16. Moreover, for example, when the first electrode layer 17 has the same thickness as that in the conventional case, reduction in the ON-resistance can be achieved by additionally disposing the second electrode layer 18.

Furthermore, the larger the thickness of the second electrode layer 18, the more advantageous it is for the reduction in the ON-resistance. Moreover, impact of wire bonding can be reduced by use of the thickness of the second electrode layer 18.

Note that the Au/Al eutectic layer is formed around the wire bonding region. Therefore, if the first nitride film 21 is disposed at least in a region directly below the wire bonding region between the second electrode layer 18 and the first electrode layer 17, the stress can be reduced.

With reference to FIG. 1 again, the first opening OP1 and the second opening OP2 will be described.

The second metal layer 18 is formed in substantially the same pattern as that of the first metal layer 17. However, an opening width w2 of the second opening OP2, which separates the second source electrode 18s from the second gate pad electrode 18g, is different from an opening width w1 of the first opening OP1 which separates the first source electrode 17s from the first gate pad electrode 17g.

To be more specific, the opening width w1 of the first opening OP1 is 3 μm, which is the same as the thickness of the first electrode layer 17. Moreover, the opening width w2 of the second opening OP2 is larger than the opening width w1 of the first opening OP1, and is, for example, 30 μm.

For the reduction in the ON-resistance of the MOSFET, it is better for each of the first and second electrode layers 17 and 18 to have large thicknesses. However, in a case where the electrode layers are patterned by wet etching, the thickness of the first electrode layer 17 is limited by a side etching amount in patterning (in formation of the first opening OP1). Specifically, side etching takes place for an amount equivalent to that of etching in a depth (thickness) direction. Thus, if the thickness of the first electrode layer 17 is set too large, the opening width w1 of the first opening OP1 is increased. This means that pattern arrangement of the first source electrode 17s (the element region 20) and the first gate pad electrode 17g is expanded more than necessary, and leads to a problem that chip miniaturization and an increase in the number of cells are hindered.

Because the minimum size of the first opening OP1 depends on the film thickness, the film thickness is determined so as to provide the required minimum opening size. In this embodiment, that thickness is 3 μm. Moreover, the opening width w1 of the first opening OP1 is reduced as much as possible on the condition that patterning can be performed in consideration of the thickness of the first electrode layer 17, and the chip size (or the number of cells).

Meanwhile, the second source electrode 18s and the second gate pad electrode 18g may be insulated from each other, and connections thereof to the element region 20 is respectively secured by the first metal layer 17. Specifically, it suffices that the second source electrode 18s and the second gate pad electrode 18g be in contact with the first source electrode 17s and the first gate pad electrode 17g, respectively, securing fixing regions of bonding wires. Thus, no minute pattern is needed for the second opening OP2.

Accordingly, no problems arise even if the opening width w2 is sufficiently larger than the opening width w1. To be more specific, the opening width w2 as a distance between the second source electrode 18s and the second gate pad electrode 18g is, for example, about 30 μm.

The second opening OP2 is provided so as to overlap with the first opening OP1. Here, the first opening OP1 and the first electrode layer 17 therearound are covered with a nitride film (hereinafter referred to as a second nitride film 22) to be a second insulating film. The second nitride film 22 serves as an etching stopper for the second electrode layer 18 at the time when the second opening OP2 is formed. Thus, by covering the first opening OP1 with the second nitride film 22, the wide second opening OP2 can be formed while maintaining the minute opening width w1 (a distance between the first source electrode 17s and the first gate pad electrode 17g) of the first opening OP1.

As described above, the thickness of the second electrode layer 18 of this embodiment can be set according to a desired ON-resistance without any limitations placed on the opening width w2 of the second opening OP2. Moreover, the ON-resistance can be reduced by controlling the thickness of the second electrode layer 18 alone. Thus, an existing apparatus can be utilized, and the ON-resistance is easily reduced at low costs.

As described above, the larger the thickness of the second electrode layer 18, the more advantageous it is for the reduction in the ON-resistance. Moreover, the large thickness thereof enhances uniformity in operations of the element region 20, and also enables reduction of the impact at the time of wire bonding.

Figure 3A:
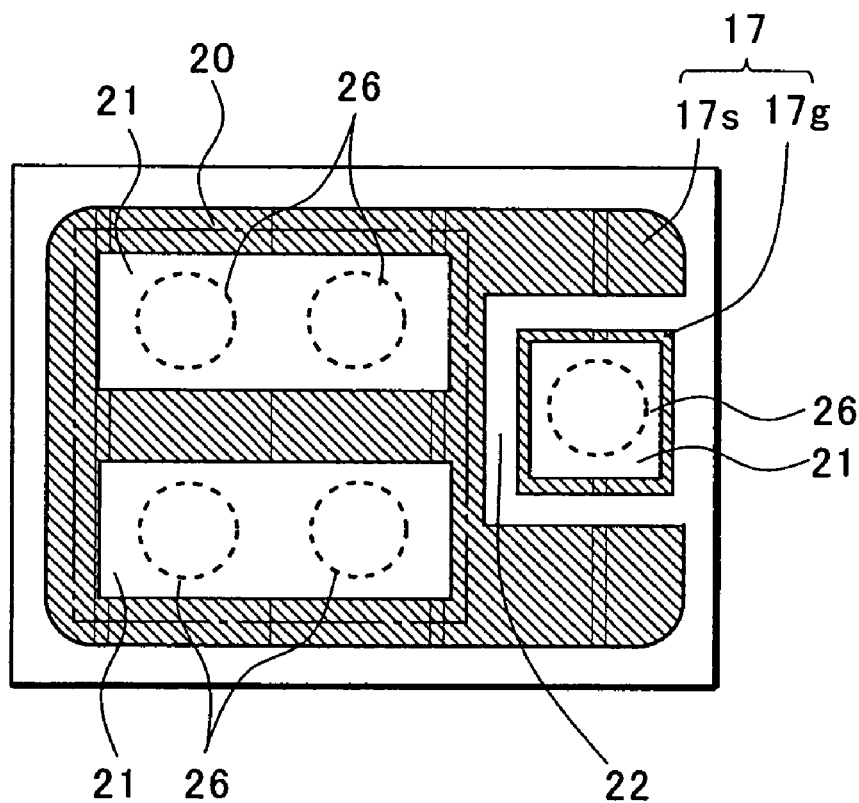
FIGS. 3A and 3B are plan views illustrating the semiconductor device of the preferred embodiment of the present invention.
Figure 3B:
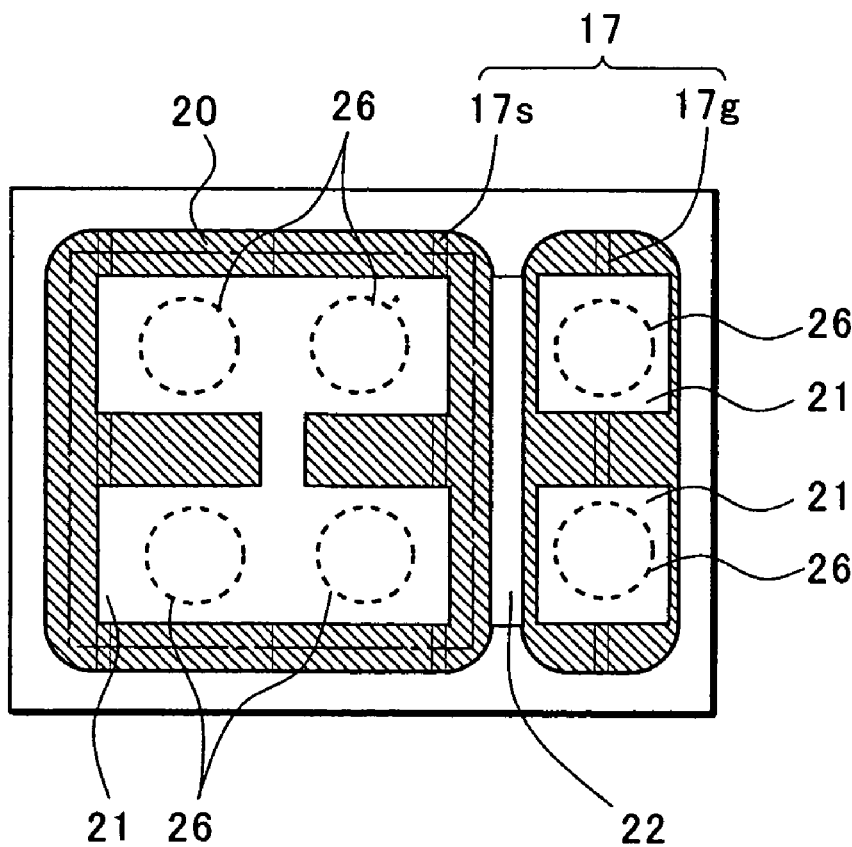

FIGS. 3A and 3B are plan views corresponding to FIG. 2A, showing other patterns of the first nitride films 21. Moreover, wire bonding regions 26 are indicated by broken circles.

FIG. 2A shows the case where the first nitride films 21 are patterned in the insular manner so as to correspond to the respective wire bonding regions 26. Meanwhile, the first nitride films 21 may be provided continuously for a plurality of the wire bonding regions 26. For example, FIG. 3A shows the case where the first nitride films 21 are provided so as to continuously arrange the regions which correspond to adjacent wire bonding regions 26 on the side of the first source electrode 17s.

Moreover, FIG. 3B shows the case where the first nitride films 21 are patterned so as to continuously arrange all regions which correspond to the wire bonding regions 26 on the side of the first source electrode 17s. Furthermore, when the first gate pad electrode 17g is sufficiently larger than the wire bonding region 26, the first nitride film 21 on the first gate pad electrode 17g may be divided into a plurality of parts.

Figure 4:
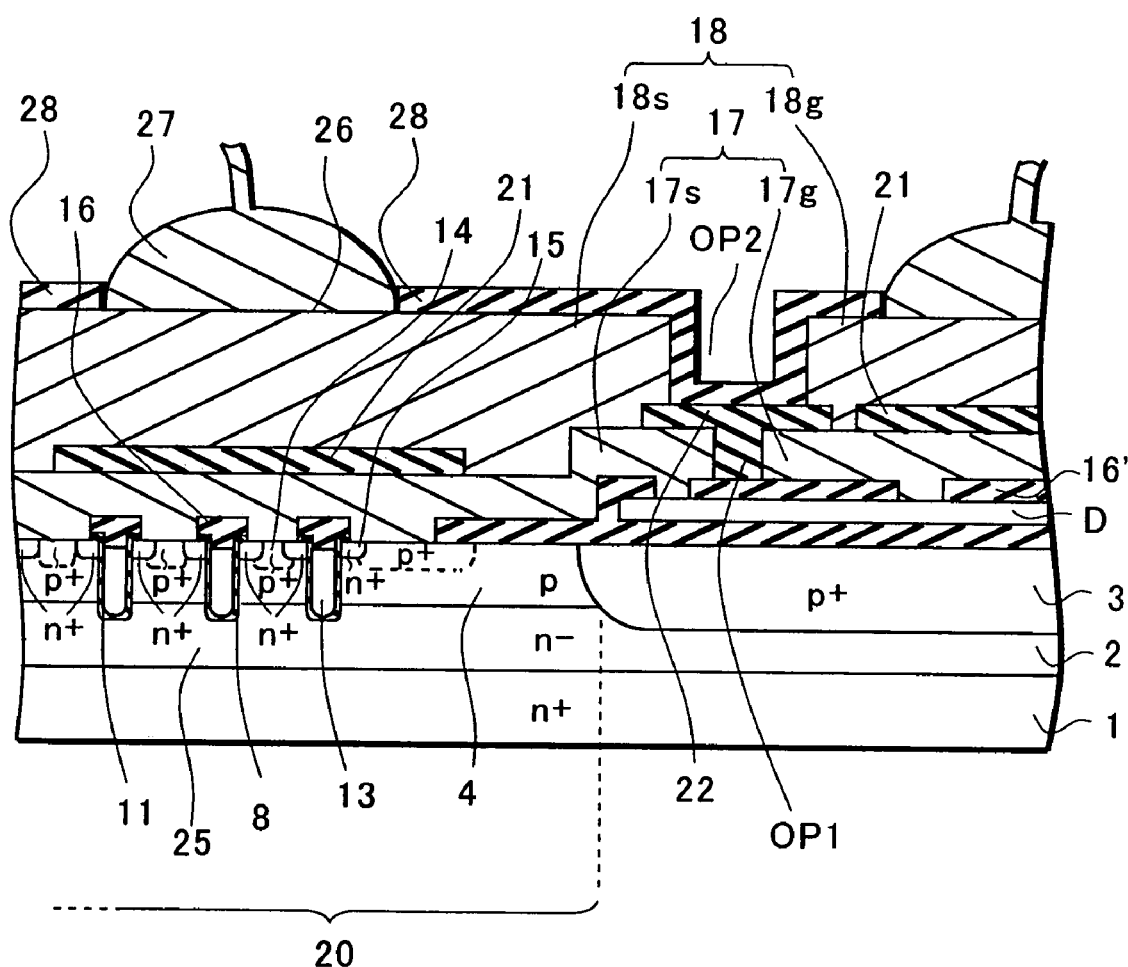
FIG. 4 is a cross-sectional view illustrating the semiconductor device of the preferred embodiment of the present invention.

Note that, as shown in FIG. 4, a protective film 28 may be further provided on the second metal layer 18. The protective film 28 is, for example, a nitride film, which covers the entire surface of the chip, and has a thickness of about 7000 Å. The bonding wire 27 is fixed to the wire bonding region 26 of the second metal layer 18 through an opening provided in the protective film 28.

Next, FIGS. 5 to 8 show a method for manufacturing a semiconductor device of an embodiment of the present invention by taking an n-channel MOSFET as an example.

First step (FIGS. 5A to 5C): a step of forming an insulated gate semiconductor element region on a substrate.

A drain region is formed by superposing an n− type semiconductor layer (epitaxial layer) 2 on an n+ type silicon semiconductor substrate 1. A p+ type region 3 is formed by implanting and diffusing high concentration of boron into an end of a formation region of a channel layer. After a thermally-oxidized film (not shown) is formed on the surface of the substrate, the thermally-oxidized film in the formation region of the channel layer is etched. Boron is implanted into the entire surface, for example, at a dose of $1.0 \times 10^{13}$ cm$^{-2}$, and is diffused to form a p type channel layer 4.

By use of a CVD method, a CVD oxide film (not shown), which is made of NSG (non-doped silicate glass), is formed on the entire surface. Thereafter, a mask made of a resist film is provided except for an opening portion of a trench. The CVD oxide film is partially removed by dry etching to expose the channel layer 4.

Figure 5A:
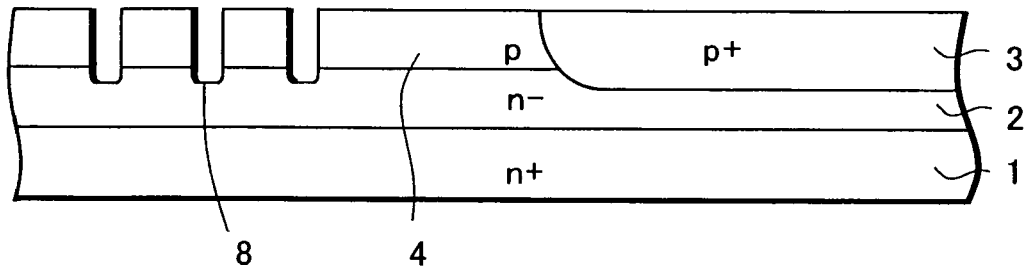
FIGS. 5A to 5C are cross-sectional views illustrating a method for manufacturing a semiconductor device of the preferred embodiment of the present invention.

Thereafter, by using the CVD oxide film as a mask, the substrate in the opening portion of the trench is dry-etched with CF and HBr gas to thereby form a trench 8, which penetrates the channel layer 4, and which reaches the n− type semiconductor layer 2 (FIG. 5A).

Dummy oxidation is performed to form an oxide film (not shown) on an inner wall of the trench 8 and on the surface of the channel layer 4. Thus, etching damage due to dry etching is removed. Thereafter, the oxide film and the CVD oxide film are removed by etching.

Furthermore, the entire surface is oxidized to form a gate oxide film 11 on the inner wall of the trench 8 so as to have a thickness of, for example, about 300 Å to 700 Å according to a drive voltage. A polysilicon layer is deposited on the entire surface, a mask having a desired pattern is provided, and dry etching is performed. The polysilicon layer may be a layer formed by depositing polysilicon containing impurities, or may be a layer formed by introducing impurities after depositing non-doped polysilicon.

Figure 5B:
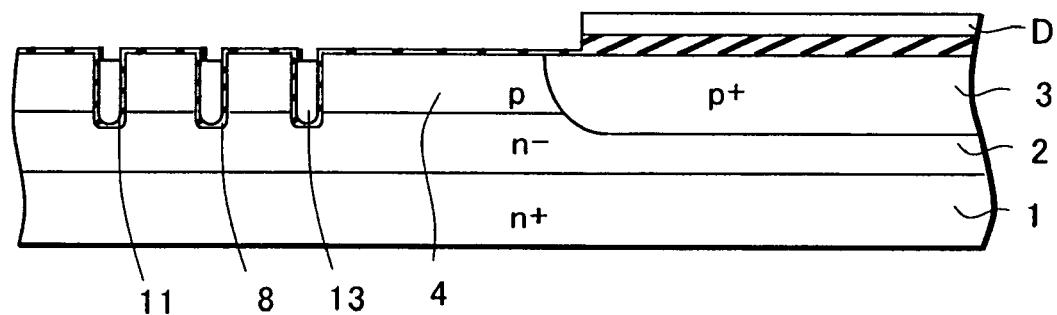

Thus, a gate electrode 13 buried in the trench 8 is formed. Moreover, a polysilicon layer 13d to be a protection diode, a connection part (not shown) between the protection diode and the gate electrode 13, and the like, are also patterned (FIG. 5B).

Thereafter, in order to stabilize a potential of the substrate, a mask made of a resist film (not shown), in which a formation region of a body region is exposed, is provided, and boron is selectively implanted by ion implantation at a dose of, for example, $2.0 \times 10^{15}$ cm$^{-2}$. By using a new resist film (not shown), arsenic is implanted by ion implantation into a formation region of a source region at a dose of, for example, about $5.0 \times 10^{15}$ cm$^{-2}$.

On the entire surface, an insulating film 16' is formed. The insulating film 16' is obtained by depositing NSG or PSG (not shown), a BPSG (boron phosphorus silicate glass) layer and the like, by use of the CVD method. By heat treatment in this event, an n+ type source region 15 and a body region 14 are formed in the surface of the channel layer 4, the body region 14 being formed so as to be adjacent to the source region 15.

At least the gate electrode 13 of a MOSFET is covered with a resist film, and a contact hole CH is formed in the insulating film 16'. Concurrently, an interlayer insulating film 16 is formed.

Figure 5C:
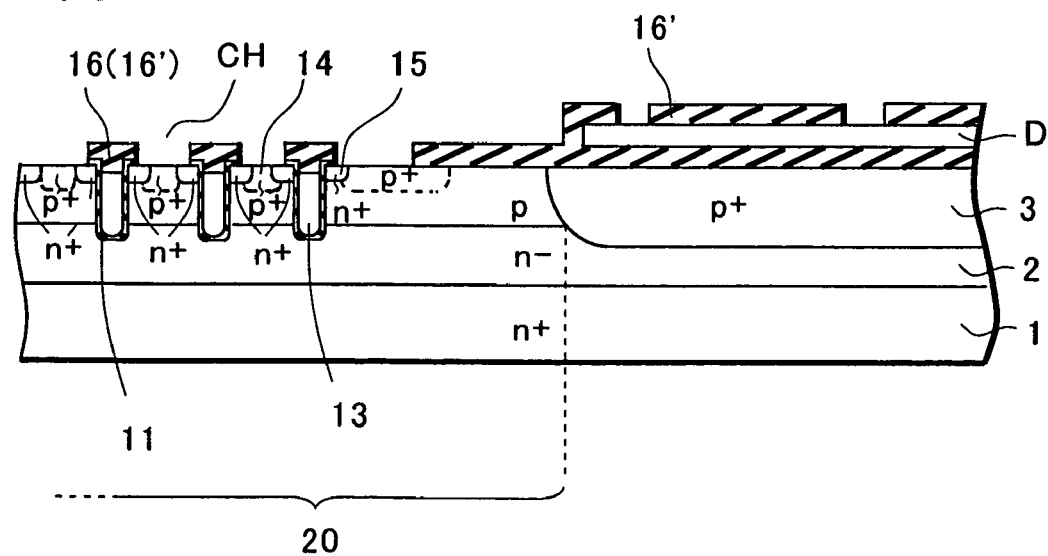
Figure 6:
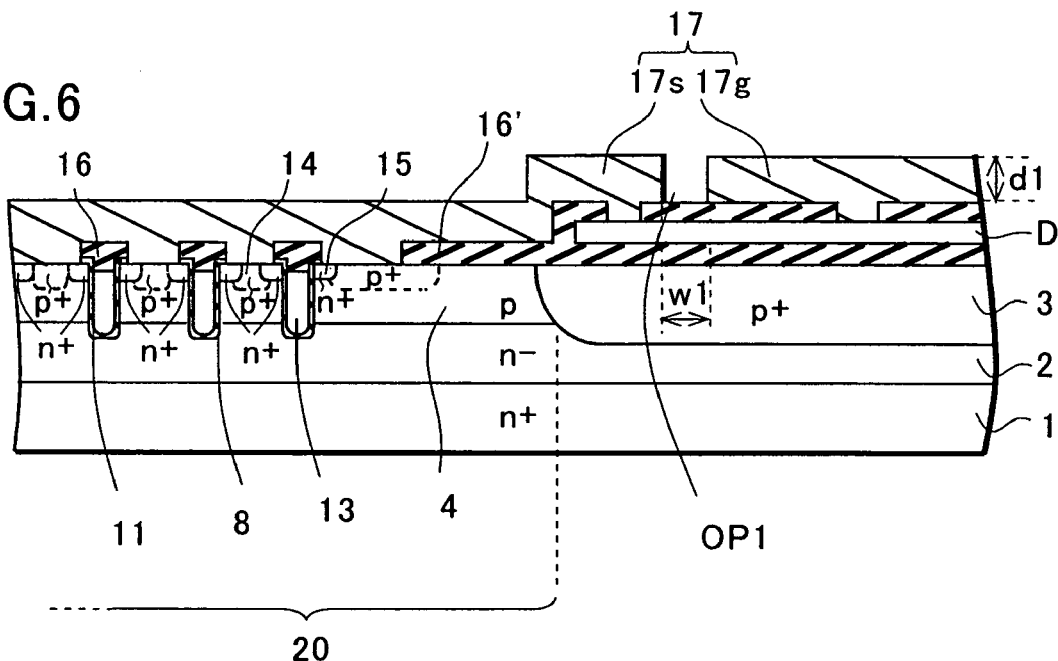
FIG. 6 is a cross-sectional view illustrating the method for manufacturing a semiconductor device of the preferred embodiment of the present invention.
Figure 7:
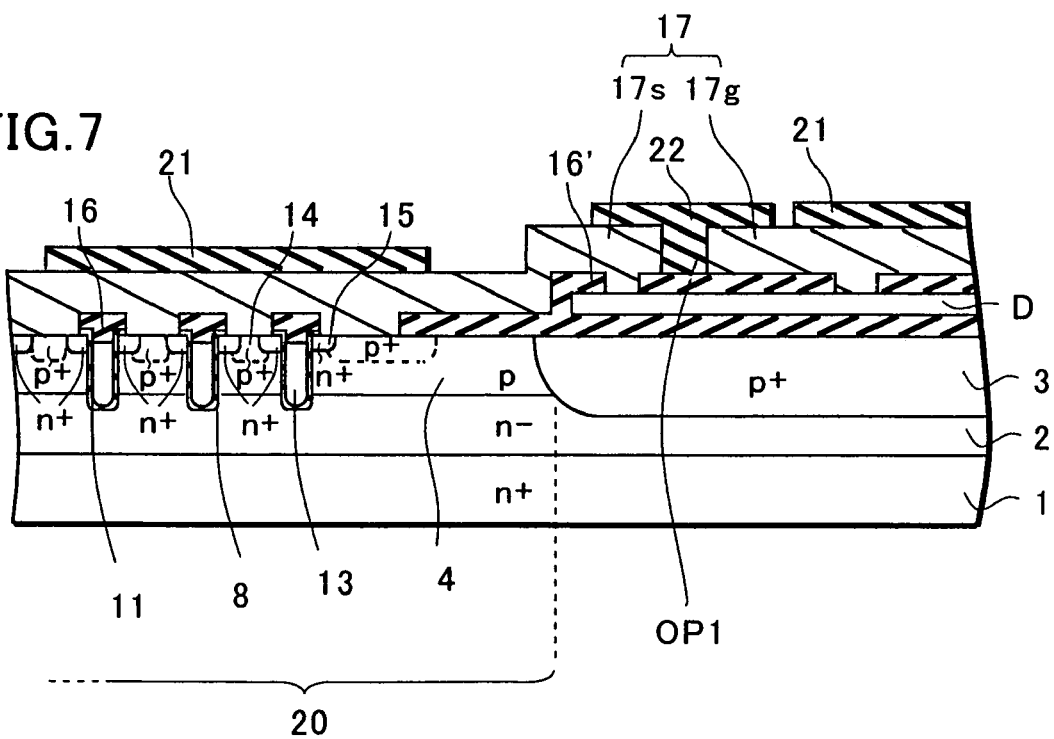
FIG. 7 is a cross-sectional view illustrating the method for manufacturing a semiconductor device of the preferred embodiment of the present invention.
Figure 8:
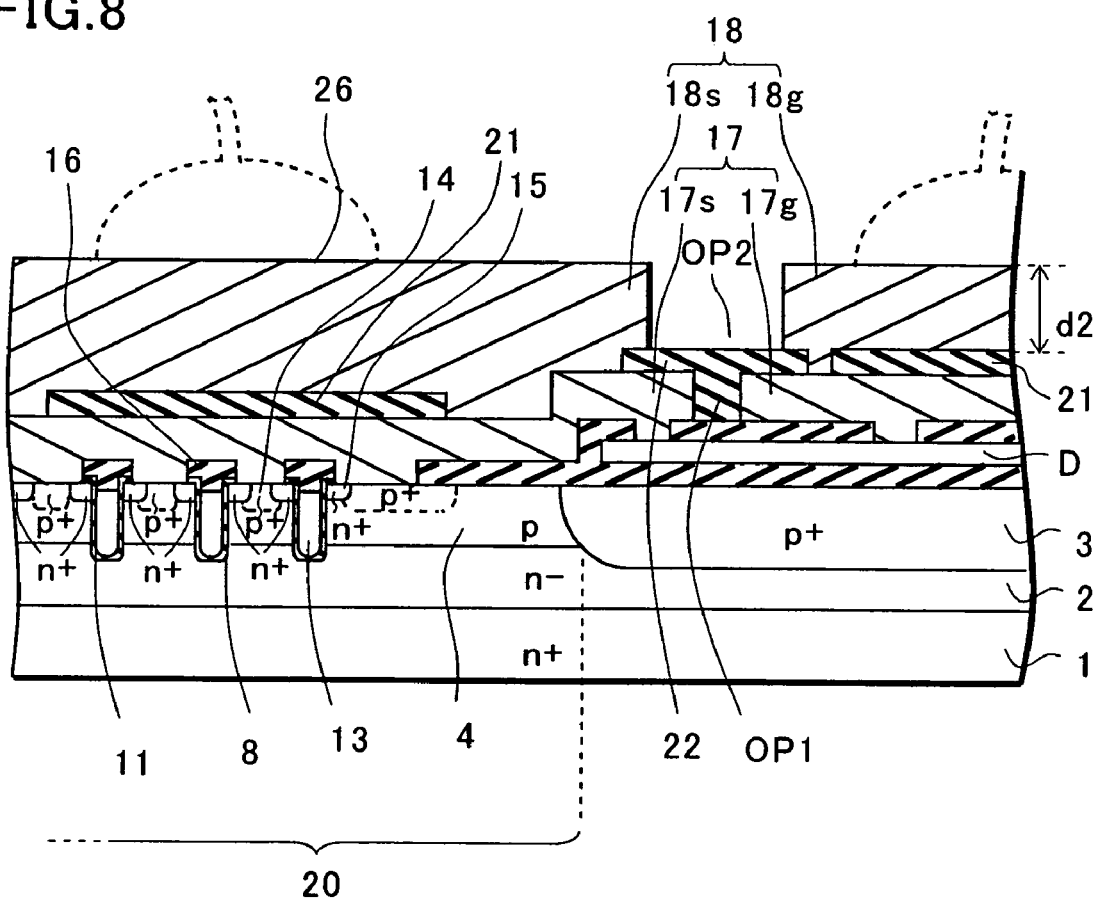
FIG. 8 is a cross-sectional view illustrating the method for manufacturing a semiconductor device of the preferred embodiment of the present invention.
Figure 9A:
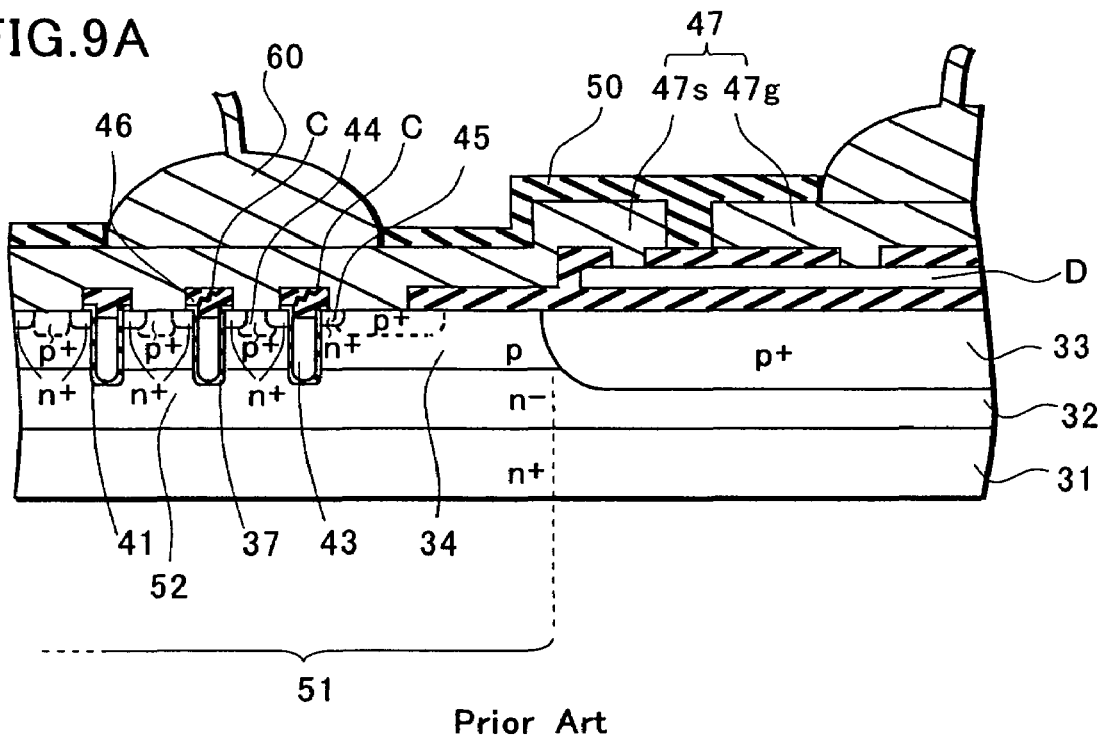
FIG. 9A is a cross-sectional view.
Figure 9B:
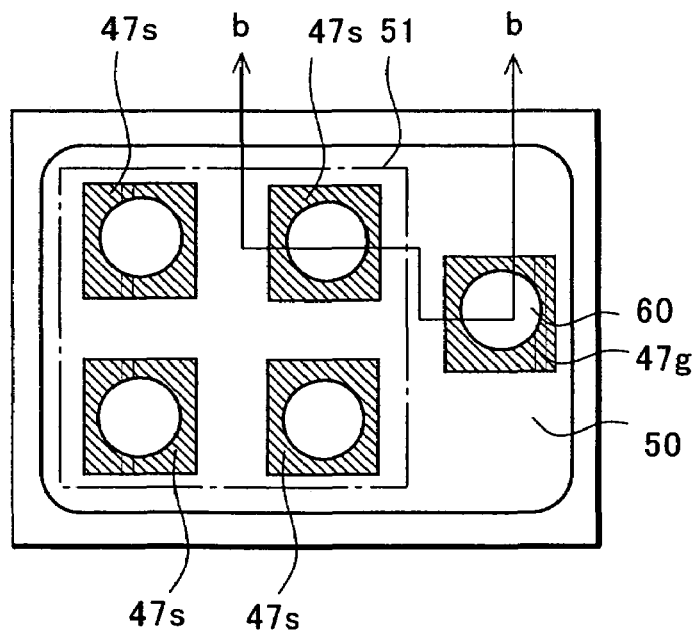
FIG. 9B is a plan view, illustrating a conventional semiconductor device.

Accordingly, an element region 20, in which a MOSFET 25 is disposed in the substrate, is formed (FIG. 5C).

Note that the order of implanting the impurities may be reversed between the source region 15 and the body region 14.

Second step (FIG. 6): a step of forming a first electrode layer, which covers at least the element region, and which is connected to the element region.

For example, aluminum alloy is sputtered on the entire surface to form a first electrode layer 17 on the entire surface of the substrate. Thereafter, by use of a mask having a desired pattern, a first opening OP1 having an opening width w1 is formed, and the first electrode layer 17 is separated into a plurality of regions. Accordingly, formed are a first source electrode 17s which are in contact with the source region 15 and the body region 14 of the MOSFET 25 and a first gate pad electrode 17g. The first electrode layer 17 has a thickness d1 of about 3 μm. Moreover, the opening width w1 to be a distance between the first source electrode 17s and the first gate pad electrode 17g is also about 3 μm. The opening width w1 is reduced as much as possible in consideration of the thickness of the first electrode layer 17 for reducing an ON-resistance, a chip size (the number of cells), limitations in processes, and the like.

Note that, although not shown in the drawings, the first electrode layer 17 may include a barrier metal layer and the like. The barrier metal layer is a titanium metal layer (for example, Ti, TiN, TiON, TiW, and the like) which is formed before the aluminum alloy is sputtered. The barrier metal layer suppresses Si nodule growth in the contact hole, and prevents mutual diffusion between the aluminum alloy layer and the surface of the substrate, and the like.

Third step (FIG. 7): a step of forming an insulating film which covers a part of the first electrode layer.

A first nitride film 21 is deposited on the entire surface so as to have a thickness of, for example, about 7000 Å, and is patterned into a desired shape. The first nitride film 21 is provided at least below the wire bonding region so as to be larger than a wire bonding region, and covers a part of the first electrode layer 17 (see FIGS. 2 and 3).

At the same time, a second nitride film 22 is formed so as to cover the first opening OP1 and the first electrode layer 17 therearound. By forming the second nitride film 22, a second opening OP2 in a second electrode layer 18, which is to be formed in a subsequent step, can be formed with a desired opening width while maintaining a minute pattern of the opening width w1 of the first opening OP1.

Note that the first and second nitride films 21 and 22 are made of the same material as that of a protective film generally used for protection of a chip surface, and thicknesses thereof may also be the same as that of the protective film. Specifically, the first and second nitride films 21 and 22 can be formed only by changing masks for patterning thereof while utilizing existing apparatus and manufacturing steps for forming the protective film.

Fourth step (FIG. 8): a step of forming a second electrode layer which covers the first electrode layer and the insulating film, and which is in contact with the first electrode layer exposed from the insulating film.

Aluminum alloy is sputtered again on the entire surface to form the second electrode layer 18 which is in contact with the first electrode layer 17 exposed from the first nitride film 21. Thereafter, a mask having a desired pattern is provided on the second electrode layer 18, and the second electrode layer 18 is etched to form the second opening OP2 having an opening width w2. Accordingly, the second electrode layer 18 is separated into a plurality of regions. Thus, a second source electrode 18s, which is in contact with the first source electrode 17s, and a second gate pad electrode 18g, which is in contact with the first gate pad electrode 17g, are formed.

Here, a thickness d2 of the second electrode layer 18 is, for example, about 3 μm. Moreover, the opening width w2 to be a distance between the second source electrode 18s and the second gate pad electrode 18g, is different from the opening width w1 of the first opening OP1. To be more specific, the opening width w2 is sufficiently larger than the opening width w1, and is about 30 μm.

The first electrode layer 17 and the second electrode layer 18 are the same aluminum alloy layer. In this embodiment, the second nitride film 22, which is to be served as an etching stopper for the second electrode layer 18, is disposed. Thus, the second opening OP2 having the wide opening width w2 can be formed while maintaining the minute opening width w1 of the first opening OP1. Moreover, since reduction in the opening width w2 needs not be considered, the second electrode layer 18 can be set to have a desired thickness according to the ON-resistance. Note that the thickness d2 of the second electrode layer 18 is an example, and is appropriately selected according to characteristics such as the ON-resistance.

Thereafter, a bonding wire (a thin Au wire) is fixed to a predetermined wire bonding region 26 on the second electrode layer 18. Thus, a final structure shown in FIG. 1 is obtained. The first nitride film 21 is disposed below the wire bonding region 26.

Au and Al may be mutually diffused as time passes, to form an Au/Al eutectic layer, and cause volume expansion due to the Au/Al eutectic layer. However, in this embodiment, stress caused by the volume expansion can be reduced by the first nitride film 21. Accordingly, the stress caused by the volume expansion is not applied to the interlayer insulating film 16. Thereby, cracks C can be prevented.

Note that a protective film 28 may be formed on the second electrode layer 18. In this case, the protective film 28 is formed by depositing a nitride film or the like on the entire surface of the second electrode layer 18. Thereafter, an opening is provided in the wire bonding region 26 on the protective film 28, and the bonding wire 27 is fixed thereto.

As described above, in the embodiment of the present invention, the description has been given for the case where the n-channel MOSFET is disposed in the element region, as an example. However, the embodiment of the present invention is not limited to the above case. For example, a MOS transistor having a reversed conductivity type or an insulated gate semiconductor element, such as an IGBT, in which a p type semiconductor substrate is provided below an n+ type semiconductor substrate, may be disposed in the element region.

According to an embodiment of the present invention, first, the insulating film, which is disposed between the first and second electrode layers in a bonding wire fixing region, can prevent cracks in an interlayer insulating film, cracks stemming from formation of an Au/Al eutectic layer. Specifically, even when volume expansion is caused by the formation of the Au/Al eutectic layer, the insulating film disposed between the first and second electrode layers receives stress generated by the volume expansion. It is therefore made possible to avoid pressure to the interlayer insulating film, and to prevent cracks therein.

Secondly, it is made possible to increase a total thickness of a metal electrode layer, and to realize reduction in an ON-resistance of the semiconductor device. The metal electrode layer is formed of the first and second electrode layers. The first electrode layer is formed to have a thickness, for which side etching amount in patterning (in formation of a first opening) is considered. Moreover, on the first electrode layer, the second electrode layer is formed to have a desired thickness. An opening width of the first opening is a distance between a source electrode and a gate pad electrode on the element region. The two electrodes are disposed as close to each other as possible on the condition that patterning can be performed. Specifically, the film thickness is determined so as to provide the required minimum opening size. It suffices that the second electrode layer be in contact with the first electrode layer, and miniaturization is not required for a pattern of the second electrode layer. Thus, since a resolution of a resist film is not so required, the second electrode layer can be formed to have a desired thickness according to an ON-resistance value.

Thirdly, since the total thickness of the electrode layer on the element region can be increased, impact of wire bonding on the element region can be reduced.

What is claimed is:
1. An insulated gate semiconductor device comprising:
   a semiconductor substrate comprising an element region comprising a plurality of insulated gate elements formed in the substrate;
   a lower electrode layer disposed on the element region and connected with the element region;

an upper electrode layer disposed on the lower electrode layer so that part of the upper electrode layer is in contact with the lower electrode layer; and an insulating film disposed between the lower and upper electrode layers, wherein the lower electrode layer comprises a first lower electrode portion and a second lower electrode portion having a first gap therebetween, the upper electrode layer comprises a first upper electrode portion and a second upper electrode portion having a second gap therebetween, and the first gap and the second gap have different widths.

2. The insulated gate semiconductor device of claim 1, further comprising a bonding wire attached to a portion of the upper electrode layer that covers the insulating film.

3. The insulated gate semiconductor device of claim 1 or 2, wherein each of the upper and lower electrode layers comprises aluminum or an aluminum alloy.

4. The insulated gate semiconductor device of claim 2, wherein the bonding wire comprises gold.

5. The insulated gate semiconductor device of claim 2, wherein the insulating film comprises a plurality of insulating film portions isolated from each other.

6. The insulated gate semiconductor device of claim 1 or 2, wherein the insulating film comprises a nitride film.

7. The insulated gate semiconductor device of claim 1 or 2, wherein the insulating film has a thickness of 0.5 µm to 3 µm.

8. The insulated gate semiconductor device of claim 2, further comprising a protective film disposed on the upper electrode layer and having an opening through which the bonding wire contacts the upper electrode portion.

9. The insulated gate semiconductor device of claim 1, further comprising an additional insulating film filling the first gap.

10. A method of manufacturing an insulated gate semiconductor device, comprising:

providing a semiconductor substrate comprising an element region comprising a plurality of insulated gate elements formed in the substrate;

forming a lower electrode layer on the element region so that the lower electrode is connected with the element region;

forming an insulating film on the lower electrode so that part of the lower electrode layer is not covered by the insulating film;

forming an upper electrode layer on the insulating film and the lower electrode layer not covered by the insulating film;

separating the lower electrode layer into a first lower electrode portion and a second lower electrode portion having a first gap therebetween; and separating the upper electrode layer into a first upper electrode portion and a second upper electrode portion having a second gap therebetween that is different from the first gap.

11. The method of claim 10, wherein further comprising attaching a bonding wire to a portion of the upper electrode layer that covers the insulating film.

12. The method of claim 10, further comprising forming an additional insulating film filling the first gap.

13. The method of claim 10, wherein the insulating film and the additional insulating film are formed in the same step.

14. An insulated gate semiconductor device comprising:

a semiconductor substrate comprising an element region comprising an insulated gate element formed in the substrate and a terminal region configured to receive a signal for the insulated gate element;

a lower electrode layer comprising a first lower electrode portion and a second lower electrode portion, the first lower electrode portion being disposed on the element region and connected with the insulated gate element, the second lower electrode portion being disposed on the terminal region, and the first and second lower electrode portions defining a first gap therebetween;

a patterned insulating film disposed on the lower electrode layer and filling the first gap; and an upper electrode layer disposed on the patterned insulating film and comprising a first upper electrode portion and a second upper electrode portion, the first upper electrode portion being disposed on and connected with the first lower electrode portion, the second upper electrode portion being disposed on and connected with the second lower electrode portion, and the first and second upper electrode portions defining a second gap therebetween.

15. The insulated gate semiconductor device of claim 14, wherein the patterned insulating film comprises a plurality of insulating film portions isolated from each other.

16. The insulated gate semiconductor device of claim 14, wherein the patterned insulating film comprises a nitride film.

17. The insulated gate semiconductor device of claim 14, wherein the patterned insulating film has a thickness of 0.5 µm to 3 µm.

18. The insulated gate semiconductor device of claim 1, wherein the upper electrode layer is in physical contact with the lower electrode layer at a location between the upper and lower electrode layers where the insulating film does not exist.

* * * * *